(12) United States Patent
Fiolka et al.

(10) Patent No.: US 7,940,375 B2
(45) Date of Patent: May 10, 2011

(54) TRANSMISSION FILTER APPARATUS

(75) Inventors: Damian Fiolka, Oberkochen (DE); Axel Scholz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 966 days.

(21) Appl. No.: 10/591,591

(22) PCT Filed: Mar. 1, 2005

(86) PCT No.: PCT/EP2005/002148
§ 371 (c)(1),
(2), (4) Date: Jul. 16, 2007

(87) PCT Pub. No.: WO2005/085955
PCT Pub. Date: Sep. 15, 2005

(65) Prior Publication Data
US 2007/0279613 A1    Dec. 6, 2007

(30) Foreign Application Priority Data
Mar. 4, 2004   (DE) .......................... 10 2004 011 733

(51) Int. Cl.
G03B 27/72    (2006.01)
G03B 27/54    (2006.01)
(52) U.S. Cl. .......................................... 355/71; 355/67
(58) Field of Classification Search .................. 355/67, 355/71
See application file for complete search history.

(56) References Cited

U.S. PATENT DOCUMENTS

| | | | |
|---|---|---|---|
| 4,229,095 A | 10/1980 | Mir et al. | |
| 5,144,362 A | 9/1992 | Kamon et al. | |
| 5,298,365 A | 3/1994 | Okamoto et al. | |
| 5,316,896 A | 5/1994 | Fukuda et al. | |
| 5,343,489 A | 8/1994 | Wangler | |
| 6,261,728 B1 | 7/2001 | Lin | |
| 6,545,968 B1 | 4/2003 | Oakley | |
| 2002/0153362 A1 | 10/2002 | Sandstrom et al. | |
| 2002/0176166 A1 | 11/2002 | Schuster | |
| 2003/0044701 A1 | 3/2003 | Boettiger et al. | |

(Continued)

FOREIGN PATENT DOCUMENTS

DE    41 24 311 A1    1/1993

(Continued)

OTHER PUBLICATIONS

Helmut Naumann et al., "Bauelemente Der Optik", Modulatoren, 6th Ed. 1992, pp. 599-605, vol. 22, Carl Hanser Verlag Munich, Germany.

*Primary Examiner* — Peter B Kim
(74) *Attorney, Agent, or Firm* — Sughrue Mion, PLLC

(57) ABSTRACT

A transmission filter apparatus for spatially dependent intensity filtering of an incident light distribution, and illumination systems containing the same. The light transmission filter apparatus contains at least one retardation device (23) that can be operated in transmission for the purpose of producing a spatially dependent retarding effect on the light of the incident light distribution, it being possible to drive the retardation device (23) in order to produce a temporally variable, spatially dependent retarding effect, and also contains at least one polarization filter arrangement (24) arranged in the light path downstream of the retardation device. An exposure method for a substrate can advantageously be carried out with the aid of an illumination system having such a transmission filter apparatus.

37 Claims, 5 Drawing Sheets

U.S. PATENT DOCUMENTS

Figure 1:
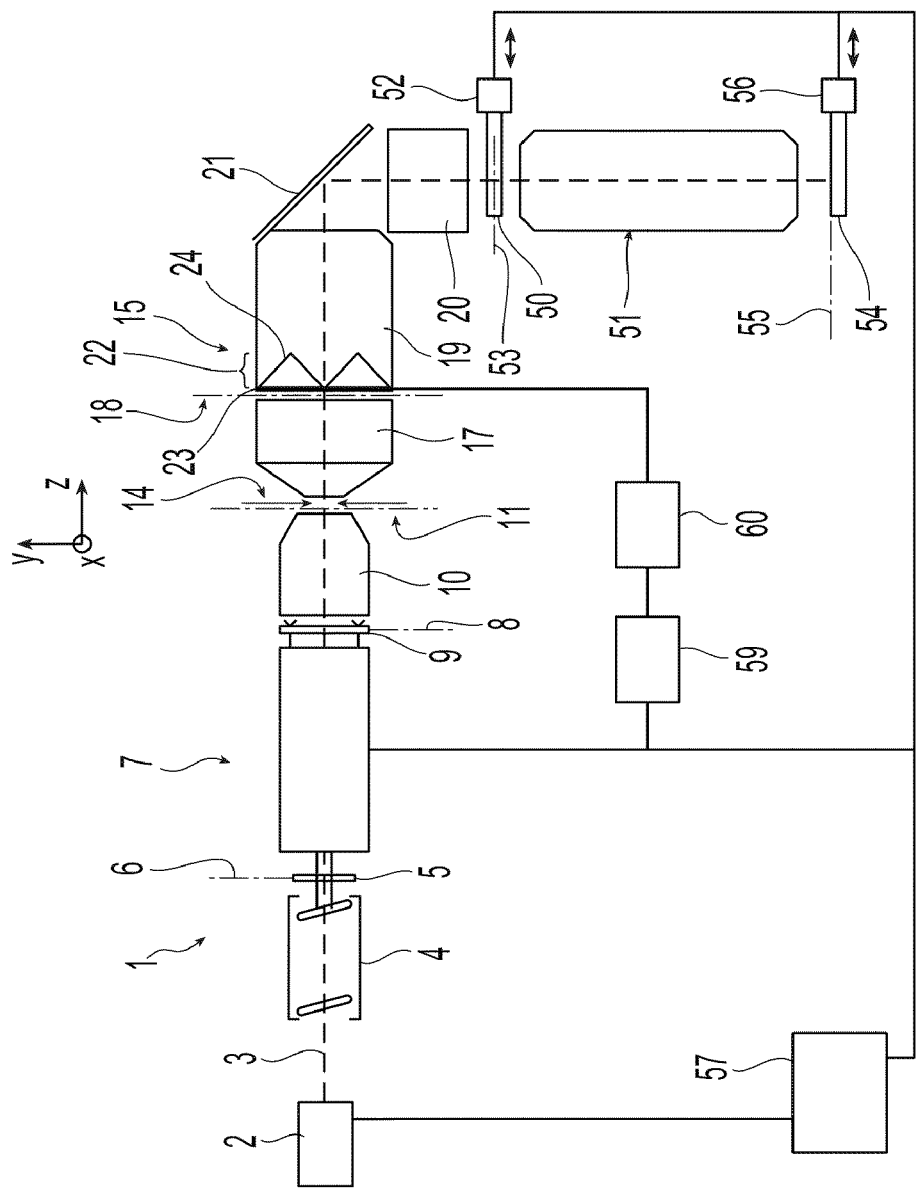

| | | |
|---|---|---|
| 2003/0128347 A1 | 7/2003 | Case et al. |
| 2004/0008397 A1* | 1/2004 | Noonan ........................ 359/245 |
| 2004/0150806 A1* | 8/2004 | Brunotte et al. ................ 355/67 |

FOREIGN PATENT DOCUMENTS

| | | |
|---|---|---|
| DE | 101 24 803 A1 | 11/2002 |
| DE | 101 27 225 A1 | 11/2002 |
| EP | 0 887 691 A2 | 12/1998 |
| EP | 1 020 769 A2 | 7/2000 |
| EP | 1 172 684 A | 1/2002 |
| EP | 0 764 858 B1 | 10/2003 |
| WO | WO 02/071136 A2 | 9/2002 |
| WO | WO 02/093257 A2 | 11/2002 |

* cited by examiner (a)　　　(b)

TRANSMISSION FILTER APPARATUS

This application is a National Stage of International Application No. PCT/EP2005/002148, filed Mar. 1, 2005, which claims benefit of German Application No. 10 2004 011 733.0, filed Mar. 4, 2004.

The invention relates to a transmission filter apparatus for spatially dependent intensity filtering of an incident light distribution, an illumination system for a microlithography protection exposure machine having such a transmission filter apparatus, and an exposure method.

The microlithographic production of semiconductor components and other finely structured components is an application in the case of which what matters, in particular, is to comply exactly with a prescribed transmission distribution having a spatially varying optical transparency. As is known, use is made to this end of wafer steppers or wafer scanners in the case of which, inter alia, there is a requirement in the image plane of a projection objective to keep the deviations in the illumination intensity from a uniform distribution as small as possible within angular ranges provided for the illumination. Specifications with deviations of less than ±2% are customary here. For a given illumination system and given projection objective, this specification is frequently not achieved directly, particularly when no light mixing device is provided in such an illumination system. An additional attenuation filter having a suitably prescribed transmission profile can be provided in the illumination system in order to eliminate an intolerable nonuniform distribution.

Such an attenuation filter for the defined attenuation of the light intensity of transmitted short wave ultraviolet light, in particular for wavelengths of less than 200 nm, in accordance with a prescribable spatial distribution of the optical transparency is described in US 2002/0191310. It has a substrate that consists, for example, of crystalline calcium fluoride and in the case of which a filter layer having a dielectric material that absorbs in the prescribed wavelength region is mounted on at least one surface. The filter layer consists essentially of tantalum pentoxide for operating wavelengths around 193 nm.

Such transmission filter apparatuses have permanently prescribable spatial dependence of the transmission, and are designed for correcting the intensity distribution for a permanently prescribed illumination setting. A change of filter must be undertaken if necessary for the purpose of flexibly adapting the intensity filtering effect when changing setting.

Digital filters such as are described, for example, in U.S. Pat. No. 6,215,578 can be used in order to produce a spatially and temporally dependent transmission filtering effect. The digital filter shown there has a raster arrangement of electronically drivable pixels that are either transparent or opaque to the irradiated light. Consequently, it is possible to set only transmittances of 100% or 0% at an individual pixel. A continuous variation of the transmission filtering effect with a spatial resolution in the region of the pixel size therefore cannot be achieved with the aid of such apparatuses.

It is known from the field of optical modulators to use the Pockels effect, which states that for specific materials their birefringence and thus a retarding effect that can be produced are directly proportional to an applied electric voltage. A Pockels cell can also be used, in conjunction with polarizers, to construct a Pockels shutter whose transmittance can be varied by a voltage applied across the Pockels cell (compare Naumann/Schröder "Bauelemente der Optik" ["Optical components"], 6th edition (1992), Carl Hanser Verlag, chapter 22.3.).

Furthermore, transparent materials having so-called "stress birefringence" are known in the case of which the birefringent properties can be influenced by applying a mechanical stress (tensile or compressive). This effect has already been used to construct retardation elements having a predetermined, homogeneous retarding effect. Examples of retardation plates that can be used, in particular, as quarter wave plates ($\lambda/4$ plates) for the deep ultraviolet region are given in U.S. Pat. No. 6,141,148, in patent application US 2002/0149848 A1 or in U.S. Pat. No. 6,084,708.

Elements having stress birefringence have also already been used to construct optical elements having a birefringent effect that differs as a function of space and can be varied by introducing external forces (WO 02/093257).

It is the object of the invention to provide a transmission filter apparatus that offers a simple possibility for providing different transmission functions. Moreover, the aim is to provide an exposure method that permits intensity to be varied in a simple way, particularly for homogenizing an intensity distribution in an illumination field of an illumination system of a projection exposure machine.

This object is achieved by means of a transmission filter apparatus having the features of claim 1, and of an illumination system having the features of claim 26, as well as of a method as claimed in claim 33.

Advantageous developments are specified in the dependent claims. The wording of all the claims is incorporated in the description by reference.

A transmission filter apparatus according to the invention comprises at least one retardation device that can be operated in transmission for the purpose of producing a spatially dependent retarding effect on the light of an incident light distribution, and that can be driven in order to produce a temporally variable retarding effect, as well as at least one polarization filter arrangement arranged in the light path downstream of the retardation device. The retardation device uses the incident light distribution to produce a light distribution that is polarized as a function of space and at which a polarization selective, spatially dependent intensity filtering is undertaken by means of the polarization filter arrangement. The retardation device is designed for setting a temporally variable retarding effect such that the intensity of the light of the incident light distribution can be filtered as a function of time and space.

There are various possibilities of undertaking on a retardation device a spatially resolving setting of locally different retarding effects. In one embodiment, the retardation device comprises a cell arrangement with a multiplicity of cells that can preferably be driven individually and independently of one another. The cells can be arranged in a two dimensional field (array). Because driving can be performed individually, it is possible to set sudden changes in the retarding effect between neighboring cells, since the retarding effects of the individual cells can be largely or completely decoupled from one another.

The retarding effect can preferably be driven continuously at each cell, and this has the result that the transmission filtering effect of the transmission filter apparatus can also be set continuously with a spatial resolution that corresponds to the surface area of the cells.

In one development, the cell arrangement comprises at least one nonlinear optical crystal for producing a linear electro-optic effect (Pockels effect) in the light passage direction of the incident light distribution. The Pockels effect is a nonlinear optical effect and therefore occurs with nonlinear optical crystals. If a potential difference U is produced between two opposite lateral faces of a, for example, cuboidal, nonlinear optical crystal, the light transirradiating the crystal undergoes a phase change d that is proportional to the applied potential difference U in accordance with: $d = 2 \cdot p \cdot r \cdot n_o^3 \cdot U / \lambda$. Here, r denotes the electro-optic constant of the crystal, $n_o$ denotes the ordinary refractive index of the crystal, and $\lambda$ denotes the wavelength of the light transirradiating the crystal. The Pockels effect is also denoted as a linear electro-optic effect, since the phase change d increases linearly with the potential difference U. A prescribable phase change d can be set by means of a potential difference U in a particularly easy and accurate fashion owing to this linear dependence.

In one embodiment, the nonlinear optical crystal is transparent to light in a wavelength region below 200 nm. Crystals that are transparent below this wavelength are particularly suitable for use in microlithography, in which wavelengths of below 200 nm, in particular 193 nm or 157 nm are used to produce very fine semiconductor structures with the aid of illuminating light.

In one development, the nonlinear optical crystal consists essentially of beta barium borate (BBO), potassium hydrogen phosphate (KDP), deuterated potassium hydrogen phosphate (DKDP) or lithium triborate ($LiB_3O_5$, LBO). Crystals made from these materials are also transparent at wavelengths of less than 200 nm. KDP and DKDP have a transmission region from approximately 190 nm to approximately 1500 nm. The transmission region for LBO reaches from approximately 160 nm to approximately 2600 nm. It follows that applications in the visible or in the infrared region are also possible. In one embodiment of the transmission filter apparatus, the nonlinear optical crystal is designed as a plane plate that completely covers the region of the incident light distribution and has a first and a second plate face. The configuration of the nonlinear optical crystal as a plate has the advantage that it is possible to save overall volume, and that devices for producing a potential difference between the first and the second plate face can advantageously be fitted on the plane plate faces. The plate is preferably oriented such that the incident light distribution is incident on the plate faces in substantially vertical fashion.

In one development, in order to produce a cell arrangement a plurality of first electrodes electrically separated from one another are mounted on the first plate face, and a plurality of second electrodes electrically separated from one another are mounted on the second plate face, and first and second electrodes are assigned to one another in pairs in order to form a plurality of electrode pairs electrically separated from one another, each electrode pair defining a cell of the cell arrangement. In the case of some embodiments, a defined voltage difference, and thus a defined retarding effect, can be set with each electrode pair independently of the other electrode pairs. It can also be provided to drive a number of electrode pairs in groups. The electrodes of each electrode pair are advantageously arranged on the first and second plate face in a fashion opposite one another, the plurality of electrode pairs being intended in essence to cover completely the part of the plane-parallel plate of which the light distribution is incident. The electrode pairs can be arranged right next to one another without the electric fields caused by the voltage differences of the individual pairs overlapping. It is thereby possible to ensure a high spatial resolution of the spatially dependent retarding effect. However, for reasons of electrostatics the spacing between electrodes of an electrode pair should be significantly smaller than the spacing between neighboring electrode pairs. It can thereby be ensured that the electric field is formed in practice exclusively between the electrodes of an electrode pair lying opposite one another.

In one embodiment of the transmission filter apparatus, in order to produce a cell arrangement a plurality of first electrodes electrically separated from one another are mounted on the first plate face, and at least one second electrode is mounted on the second plate face, a number of first electrodes being assigned to a common second electrode. It is thereby possible to reduce the outlay required for making electric contact with the second electrodes.

In one development, in order to produce a cell arrangement a plurality of first electrodes electrically separated from one another are mounted on the first plate face, and the second plate face has a single second electrode to which the plurality of first electrodes are assigned. The second electrode can easily be mounted on the second plate face. In order to produce spatially dependent potential differences, it suffices when only one side of the plate is provided with electrically separated electrodes. The second electrode can serve the purpose of producing a reference potential (for example frame potential for all first electrodes). It is thereby possible for a single contact conductor track to suffice for forming contact on sides of the second electrode, as a result of which the electric connection of the cell arrangement is greatly simplified.

In one embodiment of the transmission filter apparatus, electrodes electrically separated from one another in pairs are arranged on the crystal at a spacing from one another that is large compared with the plate thickness of the crystal. This ensures that no significant electric fields occur between neighboring cells, and so the potential difference of each cell can be set independently of the potential differences of neighboring cells.

In one development, the electrodes are substantially free from regions (material tips) causing high field strengths. Wear of the crystal material can be effectively prevented by avoiding high field strengths. Material tips can be prevented by a suitably selected geometry of the electrodes, for example, by rounding corners or edges.

In one embodiment of the transmission filter apparatus, at least one electrode has an antireflection layer. Antireflection layers contribute to the avoidance of light losses and of scattered light.

In one development, at least one electrode is designed as a grid electrode with a plurality of webs made from electrically conducting material and with a high transparent area fraction. Because of the high transparent area fraction, only a small proportion of the light of the incident light distribution is lost by absorption and/or reflection at the electrically conducting material.

In one embodiment of the transmission filter apparatus, the electrodes are designed to be partially transparent in such a way that the transmission loss that is caused in the incident light distribution by the electrodes is less than 10% upon passage through the cell arrangement. Here, the electrodes can be formed from partially transparent material that fills up the area, or can be designed as grid electrodes as represented above.

In one embodiment of the transmission filter apparatus, the latter is assigned a control device for producing electrical potential differences, which can be set independently of one another, between in each case one of the first electrodes, electrically separated from one another, of the first plate face, and at least one assigned electrode of the second plate face. To this end, the control device should be configured in such a way that a number of variably prescribable potentials that corresponds to the number of the first electrodes can be made available, for example by multiple voltage division of a maximum voltage. It should be possible for each individual potential to be set continuously between a maximum value and a minimum value corresponding to the frame potential.

In another embodiment, the retardation device comprises at least one retardation element made from a stress birefringent material, and a stressing device having at least one actuator, acting on the retardation element, for variably setting a prescribable stressed state of the retardation element in accordance with a prescribable spatial distribution. It is thereby possible by applying a mechanical stress distribution (tensile and/or compressive stresses) to set a spatially dependent retarding effect with the prescribable spatial distribution at the retardation element. It is preferred to provide only a single retardation element, in particular in the form of an essentially plane-parallel plate. The retardation element can consist, for example, of synthetic fused quartz or of calcium fluoride. By suitably positioning and driving actuators, it is possible to set inside the retardation element a nonuniform distribution of mechanical stresses that lead to local differences in the birefringent effect of the transparent retardation element. By contrast with a cell arrangement having individual cells that can be driven independently of one another and have a retarding effect, inside a nonuniformly stressed retardation element locally effective stresses, and thus the locally occurring birefringences, are coupled to one another such that a continuous profile of the retarding effect is generally attained over the cross section of the retardation device. It is also possible here to speak of infinitely small cells that are coupled to one another.

In one development, the stressing device has at least one actuator pair with a pair of actuators that are arranged diametrically opposite one another with reference to a central axis of the retardation element. Tensile or compressive stresses that have a symmetrical spatial distribution relative to the central axis can thereby be produced in a simple way. It is possible to provide a number of actuator pairs that can be driven independently of one another and which, for example, form a cruciform arrangement or star arrangement of actuators. It is thereby possible, in particular, to set stress distributions or retardation distributions that exhibit a multiple radial symmetry with reference to the central axis, for example a 2-fold, 4-fold, 6-fold or 8-fold radial symmetry.

Suitable stressing devices with piezoelectric actuators for introducing force are disclosed, for example, in WO 02/093257 A2 from the applicant. The disclosure of this document is to this extent incorporated in this description by reference.

In the case of some embodiments, a temporally variable retarding effect of the retardation device can be achieved by virtue of the fact that the retardation device is movably mounted and can be moved, in particular rotated, as a whole relative to the remaining parts of the transmission filter apparatus. Based on the location of the transmitted radiation, this movement can lead to a temporally dependent variation in the spatial distribution of the retarding effect. A spatially different retarding effect of the retardation device can remain unchanged during the movement of the retardation device. It is likewise possible to superimpose a movement of the retardation device and a temporal change in the spatial distribution of its retarding effect. In one embodiment, a rotating device is provided for rotating the retardation device about an axis of rotation that can preferably coincide with the optical axis of an optical system, including the transmission filter apparatus, at the location of the transmission filter apparatus.

Another possibility for producing a temporally variable retarding effect of a retardation device at the location of the transmission filter apparatus consists in interchanging a first retardation device with a first spatially dependent retarding effect against at least one second retardation device with a second spatially dependent retarding effect that differs from the first retarding effect such that the interchange gives rise to a variation in the spatial dependence of the retarding effect in the effective region of the transmission filter apparatus. A changing device provided therefor for interchanging retardation devices of different spatially dependent retarding effect can be fitted with two or more different retardation devices such that any desired number of different spatial distributions of the retarding effect can be set, depending on requirement, by interchanging the retardation devices.

In one development of the invention, the polarization filter arrangement comprises at least one thin film polarizer. Thin film polarizers can be produced easily and can be designed to operate at wavelengths of less than 200 nm.

In one embodiment of the transmission filter arrangement, the polarization filter arrangement comprises at least one transparent plane plate that is arranged substantially at the Brewster angle with reference to the incident light. At the Brewster angle, the polarization splitting between light polarized perpendicular and parallel to the plane of incidence of the transparent plane plate is particularly large, and so the polarization filtering can easily be carried out at high efficiency.

The transmission filter arrangements described are adapted in particular to polarized incident light. In one embodiment, which is particularly adapted to the transmission filtering of unpolarized light, the transmission filter arrangement is assigned a polarizer arrangement that is arranged in the light path upstream of the retardation device, in order to produce from unpolarized incident light an at least partially polarized incident light distribution that strikes the retardation device. A thin film polarizer can likewise be provided to this end. If light losses are to be avoided, it is also possible to use polarizer arrangements of complex design that convert unpolarized incident light into polarized light largely without losses.

An inventive illumination system for a microlithography projection exposure machine for illuminating an illumination field with the aid of the light of a primary light source has a pupil shaping unit for producing a prescribable light distribution in a pupil plane of the illumination system, as well as at least one transmission filter apparatus. The transmission filter apparatus can serve for producing a spatially and temporally dependent intensity filtering of the illuminating light. It can be integrated into the pupil shaping unit as a part thereof, but an arrangement outside the pupil shaping unit is also possible, for example in the light path downstream of the pupil shaping unit, or near or downstream of the pupil surface whose intensity distribution is formed by means of the pupil shaping unit.

In one development of the illumination system, the transmission filter apparatus is provided in or in the vicinity of a plane of low numerical aperture, preferably in or in the vicinity of a plane of numerical aperture <0.1, particularly preferably in or in the vicinity of a pupil plane of the illumination system. Fitting in a plane of low numerical aperture contributes to the avoidance of light losses. A pupil plane suitable for fitting the transmission filter apparatus is the pupil plane of the light distribution prescribed by the pupil shaping unit.

In one embodiment of the illumination system, the latter comprises no light mixing unit for homogenizing the illuminating light. In particular, this means that neither a honeycomb condenser nor a rod integrator arrangement is present in the illumination system. The spatially dependent transmission function of the transmission filter apparatus can be designed in such an illumination system for homogenizing the illuminating radiation.

In one development of the invention, a regulating unit connected to the control device and to the pupil shaping unit is provided for tuning the spatially dependent intensity filtering to the prescribable light distribution in the pupil plane. The transmission filter apparatus can be arranged, for example, in the pupil plane in which the pupil shaping unit produces the prescribable light distribution, or in another pupil plane, for example in an imaging objective of the illumination system.

The invention also comprises an exposure method for exposing a substrate arranged in the region of an image plane of a projection objective with at least one image of a pattern, arranged in the region of an object plane of the projection objective, of a mask, comprising: illuminating the pattern with the aid of illuminating radiation from an inventive illumination system in order to produce radiation modified by the pattern; and transirradiating the projection objective with the aid of the radiation modified by the pattern in order to produce an output radiation directed onto the substrate, the intensity distribution of the illuminating radiation in the object plane of the projection objective being variably set as a function of space and time with the aid of the transmission filter apparatus. In order to influence the angular distribution of the illuminating radiation in the object plane, the transmission filter apparatus can be arranged in or in the vicinity of a pupil plane that has been Fourier transformed relative to the object plane, since a spatially dependent intensity filtering in this plane produces an angularly dependent intensity filtering in the field plane conjugate thereto. An angularly dependent intensity filtering here denotes the attenuation of the illuminating beams incident at such angles on the field plane, that emanate from locations of high intensity filtering in the pupil plane.

In one development of the exposure method, a first light distribution is firstly set at the pupil shaping element, and an assigned first spatially dependent intensity filtering is undertaken at the transmission filter apparatus, and thereafter at least one second light distribution is set at the pupil shaping element and a second spatially dependent intensity filtering is undertaken at the transmission filter apparatus. The change can be controlled as a function of the mask structures to be imaged. The intensity filtering of the transmission filter apparatus is adapted in this case to the light distribution respectively set with the aid of the pupil shaping element, for example such that a prescribed value for the uniformity of the illumination is achieved or fallen below for each illumination setting.

In one embodiment of the exposure method, the intensity distribution of the illuminating radiation is set with the aid of the control device to the minimum intensity value of the incident light distribution in order to produce a homogenizing effect. It is possible by means of this measure to homogenize the angular distribution in the object plane of the projection objective in conjunction with minimum light losses such that effects such as ellipticity, for example, that worsen imaging quality can be avoided.

Apart from proceeding from the claims, the present and further features also proceed from the description and the drawings, it being possible in each case to implement the individual features on their own or separately in the form of subcombinations in embodiments of the invention and in other fields, and to represent advantageous designs that are capable of protection per se.

Figure 2:
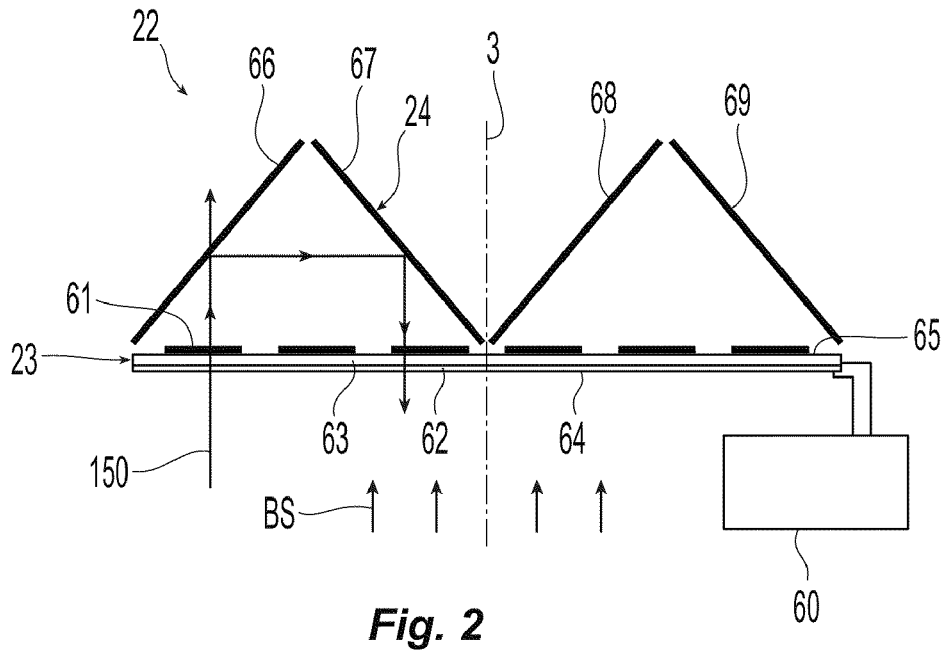
Figure 3:
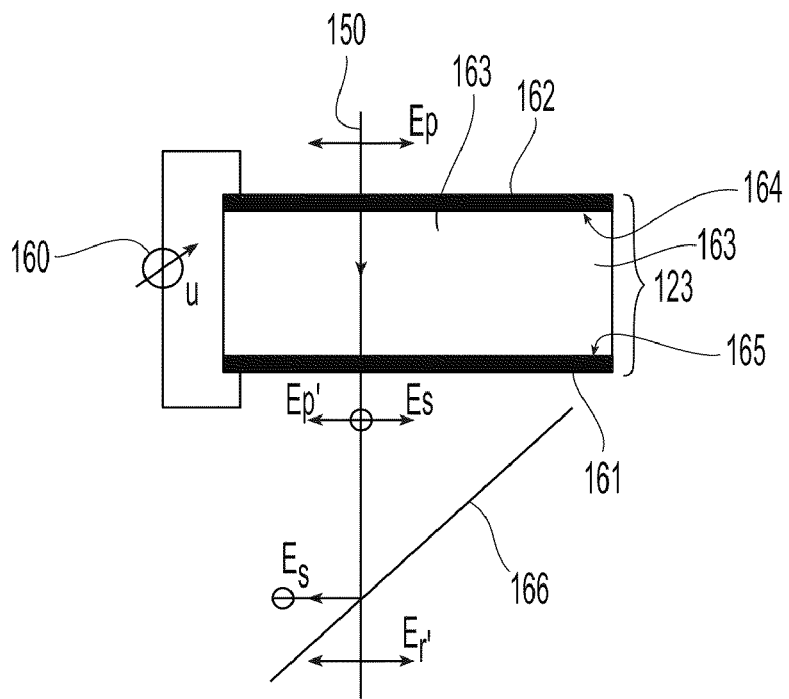
Figure 4:
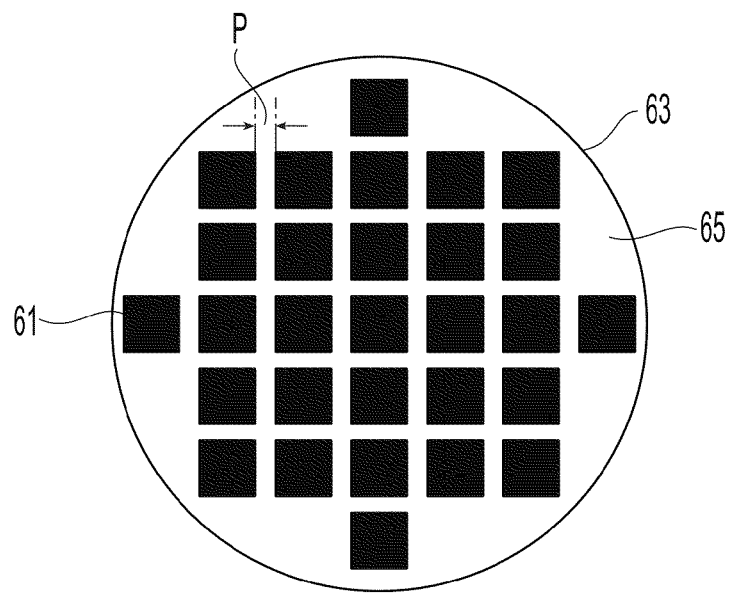
Figure 5:
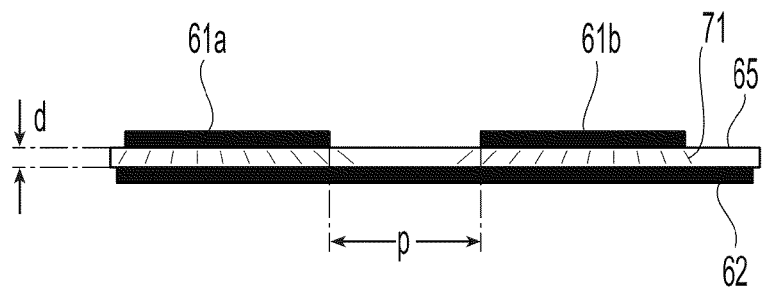
Figure 6:
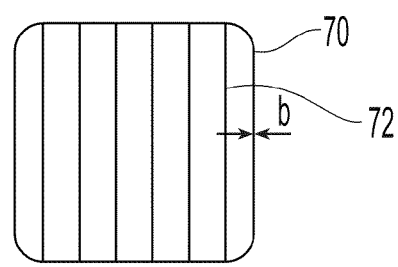
Figure 7:
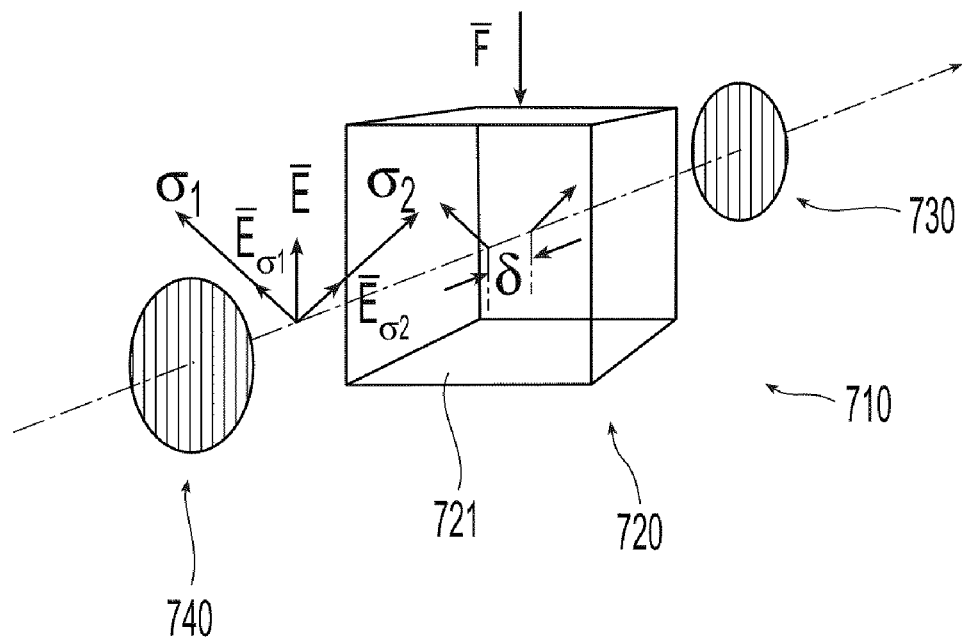
Figure 8:
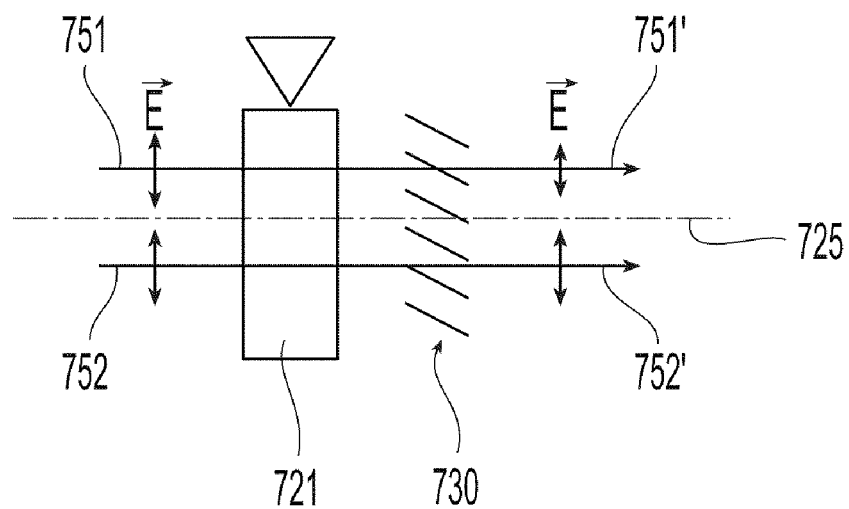
Figure 9:
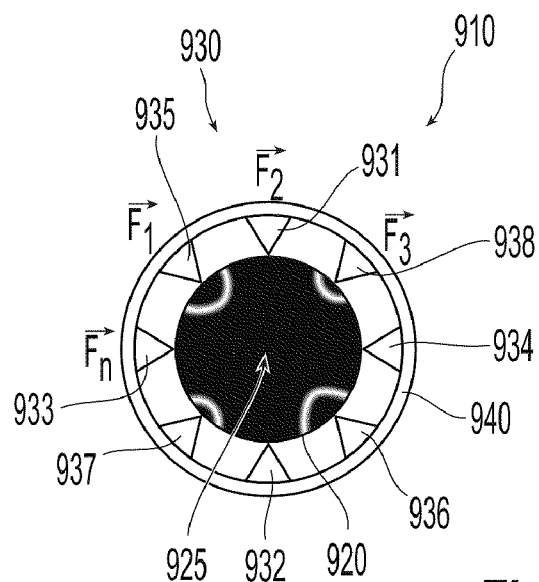
Figure 10:
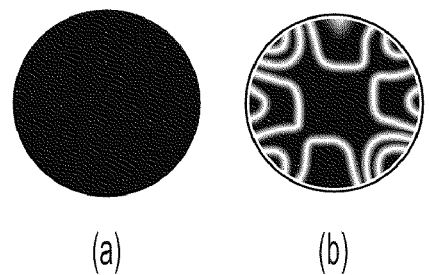
Figure 11:
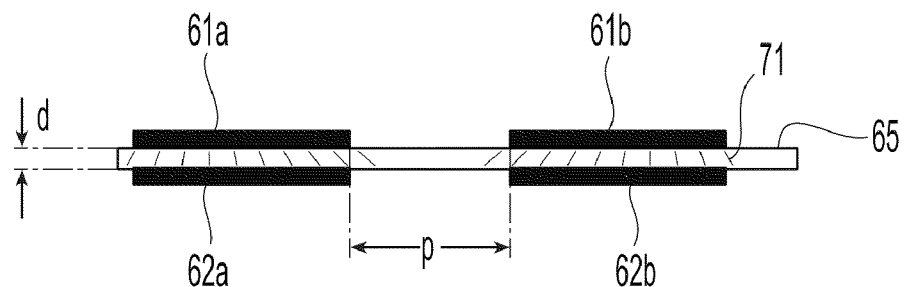

FIG. 1 shows a schematic side view of an embodiment of a microlithography projection exposure machine having an illumination system with a transmission filter apparatus, FIG. 2 shows a schematic side view of the transmission filter apparatus of FIG. 1 with a cell arrangement and a polarization filter arrangement, FIG. 3 shows a schematic drawing for explaining the functional principle of the transmission filter apparatus of FIG. 2 with the aid of a cell of the cell arrangement, and of an assigned polarization filter, FIG. 4 shows a plan view of a first side of the cell arrangement of FIG. 2 with a plurality of electrodes, FIG. 5 shows a side view of the cell arrangement of FIG. 1 with electric field lines, FIG. 6 shows a plan view of one embodiment of an electrode as grid electrode, FIG. 7 shows a schematic perspective view of another embodiment of a transmission filter apparatus in the case of which purposely stressed birefringent material is used to produce a retarding effect, varying in a spatially dependent fashion, of a retardation element, FIG. 8 shows a schematic side view of essential elements of such a transmission filter apparatus for the purpose of explaining the spatially dependent intensity filtering, FIG. 9 shows a schematic, axial plan view of a retardation element that is of round cross section and is purposely stressed mechanically with the aid of actuators of a stressing device that act on the circumference, FIG. 10 shows various spatial transmission distributions that can be attained by the transmission filter arrangement, and FIG. 11 shows a side view of the cell arrangement of FIG. 1 with a plurality of first electrodes and a plurality of second electrodes.

FIG. 1 shows an example of a microlithography projection exposure system 1 that can be used in the fabrication of semiconductor components and other finely structured components, and is operated with light from the deep ultraviolet region in order to attain resolutions of up to fractions of micrometers. Serving as light source 2 is an ArF excimer laser with an operating wavelength of approximately 193 nm, whose light beam is aligned coaxially with the optical axis 3 of the illumination system. Other UV light sources, for example $F_2$ excimer lasers with 157 nm operating wavelength, KrF excimer lasers with 248 nm operating wavelength or mercury vapor lamps with 368 nm or 436 nm operating wavelength as well as light sources with wavelengths below 157 nm are likewise possible.

The linearly polarized light from the light source 2 initially enters a beam widener 4 that can, for example, be in the form of a mirror arrangement in accordance with DE 41 24 311, and is used for coherent reduction and to enlarge the beam cross section. A first diffractive optical raster element 5, which is used as a beam shaping element, is arranged in the object plane 6 of an objective 7 arranged downstream thereof in the beam path and is designed as a variably settable part of a pupil shaping unit which produces a prescribable light distribution in its image plane or exit pupil 8. Arranged there is a refractive second optical raster element 9 that likewise serves as beam shaping element. A coupling optical system 10 arranged therebehind transmits the light to an intermediate field plane 11 in which a reticule/masking system (REMA) 14 is arranged that is used as an adjustable field diaphragm. The illuminating radiation can be homogenized by a diaphragm unit that is positioned in the vicinity of the field intermediate plane 11, in a fashion slightly offset axially from the REMA system 14, and that is fashioned or can be set such that it shields specific edge regions of the light distribution in such a way as to enable a largely homogeneous illumination of the reticule 50 in conjunction with the integrating effort of the scanning process. A device suitable for this purpose and composed of rod-shaped "finger diaphragms" that can be inserted laterally into a field dynamically and independently of one another, is exhibited in Patent Application EP 1 020 769 A2 whose content is incorporated in this description by reference.

The downstream imaging objective 15 images the intermediate field plane with the aid of the masking system 14 onto the reticule 50 (mask, lithography master) on a scale which can, for example, be selected in an interval from 2:1 to 1:5, and is preferably at approximately 1:1. The imaging objective 15 includes a first lens group 17, a pupil intermediate plane 18, a second and a third lens group 19 and 20, respectively, and, therebetween, a deflecting mirror 21 that enables the large illumination device (approximately 3 m in length) to be installed horizontally and to support the reticule 50 horizontally.

Downstream of the illumination system, a device 52 for holding and manipulating the reticule 50 is arranged such that the reticule lies in the object plane of a projection objective 51 and can be moved in this plane with the aid of a scanning drive in order to operate the scanner in a scanning direction (y direction).

Following downstream of the mask plane 53 is the projection objective 51, which acts as a reduction objective and, at a reduced scale, for example the scale of 1:4 or 1:5, projects an image of a pattern arranged on the mask onto a wafer 54 that is coated with a photoresist layer. Refractive or catadioptric projection objectives are possible. Other reduction scales, for example stronger demagnifications of up to 1:20 or 1:200 are possible. The wafer 54 is held by means of a device 56 that comprises a scanner drive in order to move the wafer synchronously with the reticule 50 in a fashion parallel thereto. All the systems are controlled by a control unit 57.

Arranged in the illumination system 1 in the vicinity of the pupil plane 18 of the imaging objective 15 is an embodiment of a transmission filter apparatus 22 according to the invention that has a cell arrangement 23 and a polarization filter arrangement 24. An electrical control device 60 for producing potential differences at the cell arrangement 23 is connected to the latter and to a regulating unit 59 that tunes the spatial intensity filtering effect of the transmission filter apparatus 22 to the light distribution (illumination setting) that can be produced with the aid of the objective 7.

The arrangement of the transmission filter arrangement 22 in the pupil plane of the imaging objective 15 constitutes only one positioning possibility. It is also possible, as an alternative or in addition, to arrange the transmission filter arrangement 22 in a pupil plane of the objective 7 or in the vicinity thereof.

The cell arrangement 23 of the transmission filter apparatus 22 shown in a schematic side view in FIG. 2 has a nonlinear optical crystal 63 that is designed as a circular plate, consists of potassium hydrogen phosphate (KDP) and has a thickness of approximately 1 to 2 mm as well as a diameter of approximately 100 mm. Mounted on a second plate face 64 serving as light entry surface is a second electrode 62 that covers substantially the entire second plate face of the nonlinear crystal 63. A plurality of first electrodes 61 electrically separated from one another are fitted on a first plate face 65 serving as light exit surface. FIG. 4 shows a plan view of this first plate face 65 of the cell arrangement 23 of FIG. 2 with the plurality of first electrodes 61. The electrodes are arranged on the circular plate face 65 of the crystal 63 in a raster arrangement of 5 times 5 square electrodes and four additional electrodes fitted in the middle of each edge of the raster arrangement. The lateral spacings p between the neighboring electrodes 61 are selected in this case such that upon application of a voltage the electric fields between neighboring electrodes do not influence one another mutually such that the retarding effect of each cell can be set independently (compare FIG. 5).

The cell arrangement 23 is assigned a control device 60 that is designed to set electric potential differences, which can be set continuously independently of one another, between in each case one of the plurality of first electrodes 61 and the second electrode 62.

In the present case, the polarization filter arrangement 24 has four plane thin film polarizers 66 to 69 that are inclined obliquely to the optical axis 3 and of which in each case one pair 66, 67 and 68, 69 together form a triangle with the plane of the plate of the nonlinear crystal. The polarization filter arrangement 24 and the cell arrangement 23 respectively cover the entire region that is covered by an incident light distribution of an illuminating radiation BS.

Otherwise than in the schematic illustration in FIG. 2, in the case of preferred embodiments the thin film polarizers are arranged such that the incidence angles of the radiation parallel to the optical axis are between approximately 65° and approximately 75°. It is thereby possible to use relatively simple thin film polarizers of simple design and with a high polarization selection efficiency. Alternatively or in addition to thin film polarizers it is also possible to use other polarization splitting optical elements, for example beam splitter cubes with a beam splitter layer surrounded on both sides by transparent material. Since such layers can be optimized for an incidence angle around 45° (vicinity of the Brewster angle), polarization filter arrangements constructed with beam splitter cubes can be of short design in the transirradiation direction, it thereby being possible to save installation space in the z direction. The Brewster angle is approximately 57° for a transition from air to glass, and approximately 33° for a transition from glass to air.

FIG. 3 shows the functional principle of the transmission filter apparatus with the aid of a detail from FIG. 2 with an electrode pair consisting of a first electrode 161 and a second electrode 162 that, together with the nonlinear optical crystal 163 lying therebetween, form a cell 123 of the raster arrangement of FIG. 4, and a thin film polarizer 166. Elements of FIG. 2 corresponding to elements of FIG. 3 are provided with reference numerals increased by one hundred. The control apparatus 160 produces a potential difference between the second electrode 161 of a second plate face 164 of the cell 123 and the first electrode 162 of the first plate face 165. A light beam 150, polarized parallel to the incidence plane of the thin film polarizer 166, with an electric field strength vector $E_p$ enters the nonlinear optical crystal at the second plate face 164 and traverses it, experiencing a retarding effect proportional to the applied voltage such that it is converted from linearly polarized into elliptically polarized light. After exiting the cell at the light exit surface 165, the light beam 150 therefore has a component $E_s$ of the electric field strength vector perpendicular to the incidence plane on the thin film polarizer 166, as a result of which the amplitude of the parallel polarized component is reduced to $|E_p'|<|E_p|$. The part of the beam 150 that is polarized perpendicular to the incidence plane is reflected at the thin film polarizer 166 and deflected by 90° in the process, while the light component $E_p'$ polarized parallel to the incidence plane traverses the thin film polarizer 166 without deflection. The reflected part of the beam is subsequently reflected at a second thin film polarizer (not shown in FIG. 3) such that it is deflected in the direction of the cell arrangement 23 and makes no contribution to the formation of scattered light (compare light beam 150' in FIG. 2). Coupling out the light component, polarized perpendicular to the incidence plane, at the thin film polarizer 166 increases the intensity (proportional to $E^2$) of the transmitted illuminating beam 150 from $(E_p')^2$ to $(E_p)^2$. The extent of this decrease in intensity can be influenced continuously by setting the potential difference U at the control device 160, since the latter prescribes the retarding effect of the cell 123.

Instead of thin film polarizers, it is also possible to use transparent plane plates arranged at the Brewster angle for the purpose of polarization filtering if the polarization distribution plays no role downstream of the transmission filter apparatus. It is advantageous here that the transmission filter apparatus can also be used in this case to reduce the intensity of light distributions with the aid of a comparatively high numerical aperture of more than 0.1, since plane plates have a large angular acceptance by contrast with the thin film polarizers.

The electro-optic constant of KDP is 10.3 pm/V. Given a crystal refractive index of $n_o=1.5$, and a wavelength of 193 nm, the effect of a phase retardation of $\lambda/4$ is achieved at a voltage of approximately 1.3 kV between the first and the second electrodes. With this retardation, a reduction in intensity of 50% with the aid of the transmission filter apparatus is already enabled, since linearly polarized input light is thereby transformed into circular polarized output light ($|E_p|=|E_s|$).

The apparatus shown in FIG. 2 has for the purpose of producing a spatially dependent intensity distribution a plurality of cells consisting respectively of a plurality of electrodes 61 and a subregion of the second electrode 62 that operate in accordance with the functional principle explained here and can be controlled independently of one another by the control device 60, since the field lines of neighboring cells do not overlap. In order to illustrate this fact, FIG. 5 shows a side view of a detail of the cell arrangement 23 of FIG. 2, in which the electric field lines occurring during operation of the cell arrangement 62 are shown. The detail shows a first and a second electrode 61a, 61b of the plurality of electrodes 61, a section of the second electrode 62 and a part of the nonlinear optical crystal 63. The plurality of the first electrodes are mounted on the first plate face 65 at a spacing p=2 mm from one another that is large by comparison with the plate thickness d=1 mm. The condition p>2·d, p>4·d or p>5·d should preferably be observed in order to avoid "crosstalk" between neighboring cells. In order to illustrate the independence of the electric fields produced by the first and the second electrode 61a, 61b of the plurality of electrodes, the field lines 71 of the fields between the electrodes 61a, 61b and the second electrode 62 are drawn in. It is clearly to be seen that the field lines of the first and the second electrode do not overlap, since the spacing p of the electrodes is selected to be sufficiently large by comparison with the thickness d of the plate. In an alternative embodiment, a second plurality of electrodes 62a, 62b can replace the second electrode 62, as depicted in FIG. 11. As with the embodiment depicted in FIG. 5, it is clearly to be seen in the embodiment of FIG. 11 that the field lines between electrodes 61a and 62a do not overlap with the fields lines of electrodes 61b and 62b.

Each individual electrode 61 consists of an electrically conducting material that is partially transparent to light and is so thin that a substantial portion of the illuminating radiation is transmitted by the electrode material. In the example, the electrodes consist of chromium that is applied to the plate with a layer thickness of between approximately 10 nm and 40 nm. The electrodes 61 are provided with rounded corners so as to avoid high field strengths that possibly trigger a material degradation at the surface of the nonlinear optical crystal (at material tips). FIG. 6 shows a plan view of one embodiment of such an electrode as a grid electrode 70. This has parallel webs 72 which have a width b that can be selected such that a large proportion of the electrode area consists of an area fraction which is not covered by a web and therefore is transparent to the illuminating radiation. The spacing between neighboring webs is small by comparison with the plate thickness p. In this embodiment of the electrode, the thickness of the electric field lines in crystal volume is reduced in accordance with the size of the transparent area fraction by comparison with an electrode completely coated with conducting material. If the electrode has, for example, a fraction of 10% of conductive material by comparison with the total area of the electrode, there is thus a need for a potential difference that is higher by a factor of approximately 10 in order to produce an identical retarding effect by comparison with an electrode consisting completely of conducting material. Since the Pockels cell arrangement operates without current, however, there is no problem in principle in setting high voltage differences. The transmission loss given a coverage of 10% of the electrode area by metal webs 72 is between 10% and 20% of the irradiated light intensity. It is presupposed for this that the metal webs of first and second electrodes are arranged congruently on the crystal, and this also prevents the vignetting losses. It goes without saying that electrode geometries other than those shown here can also prove to be advantageous, cross gratings being an example, and that, in particular, the electrodes 61 of FIG. 2 can be designed as shown in FIG. 6. The electrodes 61 are provided with an antireflection layer in order to avoid light losses.

When use is made of the transmission filter apparatus in the illumination system of FIG. 1, in addition to the homogenization of the intensity of the illuminating light it is also possible to cancel a partial depolarization of the illuminating light that is produced by optical elements 7, 10, 17 arranged between the laser 2 and the transmission filter apparatus 22, since completely linearly polarized light is present again downstream of said elements. It is also possible to arrange a plurality of cell arrangements serially (cascade) in order to increase the spatial resolution.

The spatial intensity filtering effect of the transmission filter apparatus 22 of FIG. 1 can be tuned to the light distribution (illumination setting) that can be produced with the aid of the settable part 7 of the pupil shaping unit. To this end, it is firstly possible to set a first light distribution at the settable part of the pupil shaping unit 7, for example a conventional illumination setting for producing coarsely structured semiconductor structures, and to undertake a first spatially dependent intensity filtering at the transmission filter apparatus 22 for the purpose of homogenizing the light distribution. Thereafter, a second light distribution, for example a dipole or quadrupole distribution, can be set at the settable part of the pupil shaping unit 7 for the purpose of producing finely structured semiconductor structures, and thereafter a second, spatially dependent intensity filtering adapted to this illumination setting can be undertaken.

The cell arrangement formed by the Pockels cells, which can be operated in transmission and is useful for producing a spatially dependent retarding effect on the light of the incident light distribution, and which can be driven electrically so as to produce a temporally variable, spatially dependent retarding effect can also be used without a downstream polarization filter arrangement in the projection exposure machines for microlithography and in other fields. It then operates as a retardation arrangement for the spatially dependent setting of locally different retardations at an incident light distribution. Such retardation arrangements can be used for converting an input beam incident from an input side of the retardation arrangement into an output beam that has over its cross section a spatial distribution, capable of being influenced by the retardation arrangement, of polarization states that differs from the spatial distribution of polarization states of the input radiation. Within wide limits, any desired spatial retardation distributions can be set by means of the independent electrical drive of the individual cells. Possible applications of retardation arrangements with a retarding effect that varies spatially over their cross section are disclosed, for example in patent EP 0 764 858 B1 from the applicant, or DE 101 24 803 (corresponding to US 2002/0176166 A1) from the applicant. The content of these applications forms part of the content of this description by reference.

Another embodiment of a transmission filter arrangement that can, for example, be arranged in the pupil plane of the objective 7 or in the vicinity thereof instead of the transmission filter arrangement 22 shown in FIG. 1, is described with the aid of FIGS. 7 to 10. Independently of this application, the transmission filter arrangement can also be used at another point of the illumination system, for example in the region of a field plane of the illumination system, or in other fields outside projection exposure machines in microlithography. This embodiment utilizes the possibility of producing a spatially varying stress distribution with locally different mechanically stressed states within a stress birefringent material, as a result of which a spatially dependent retarding effect is produced that leads to a spatially dependent transmission filtering in conjunction with a downstream polarization filtering.

The basic principle is firstly explained with the aid of FIG. 7. The transmission filter apparatus 710 has a retardation device 720 operated in transmission, and a polarization filter arrangement 730 arranged downstream thereof in the light path. A polarizer device 740 arranged in the light path upstream of the retardation arrangement can optionally be provided in order to produce from light incident in an unpolarized fashion an incident light distribution with polarized light that strikes the retardation arrangement. If the light to be filtered is already polarized, it is possible to dispense with the polarizer arrangement 740.

The retardation device consists of a single retardation element 721 that covers the entire cross section of the transmission filter arrangement and is made from stress birefringent material. It is known in the case of materials having stress birefringence (SDB) that it is possible by applying an external force F to produce a mechanical stressed state in which the stressed material exhibits birefringence. In this case, owing to the birefringence the components $E_{o1}$ and $E_{o2}$ of the electric field E acquire in the principal stress directions $\sigma_1$ and $\sigma_2$ a phase difference $\delta$ that is directly proportional to the principal stress difference $(\sigma_1-\sigma_2)$ in accordance with $\delta=\lambda/C(\sigma_1-\sigma_2)$. Here, $\lambda$ is the wavelength used, and C is a material constant describing the stress birefringence. Only having phase differences $\delta=n\cdot\lambda$ where $n=0, 1, 2, \ldots$ is the polarization state of the incident wave maintained after passage through the stress birefringent material; in all other cases, a change to the polarization state occurs.

Since the stressed states in the material can be influenced locally by suitable selection of the forces acting, the phase state of the radiation after passage through the retardation element is also spatially dependent. Owing to the downstream polarization filter arrangement 730, the radiation is adsorbed downstream of the retardation element in accordance with the local polarization state, thus giving rise to the desired transmission filtering with a filter effect that varies as a function of space. By appropriate selection of the parameters of stress intensity (determined by the force F acting on the material) and distribution of the acting points of the force, as well as by means of the type and shape of the stress birefringent material, it is possible for the spatial distribution of the radiation intensity downstream of the transmission filter arrangement to be manipulated in a targeted and spatially dependent fashion (over the cross section of the penetrating radiation). This is illustrated schematically in FIG. 8, which shows two beams 751, 752 that pass through the transmission filter arrangement at different points in a fashion parallel to the central axis 725 and which have the same polarization state with linear polarization before being incident on the retardation element 721. Applying the external force F at the retardation element 721 produces different mechanical stressed states at the passage locations of the beams 751, 752 such that a phase difference $\delta_1$ in the components of the electric field vector is produced for the beam 751, and a phase difference $\delta_2$ differing therefrom is produced for the beam 752. The beams that are now locally differently polarized in the light path downstream of the retardation element 721 are absorbed with different intensity by the polarization filter arrangement 730 designed as thin film polarizer, and so the beams 751', 752' have a locally different intensity after passage through the polarization filter arrangement 730.

It is clear that, for example, both symmetrical and asymmetrical absorption distributions of the transmission filter arrangement can be set depending on selection of the acting points of the external force and/or the shape of the retardation element. In the wavelength region below 200 nm that is of particular interest for application and in the field of microlithography, for example for 193 nm or 157 nm, calcium fluoride can be used as a highly transparent, stress birefringent material. If appropriate, it is also possible to use fused quartz, in particular for a wavelength of 193 nm.

FIG. 9 shows an axial plan view of one embodiment of a transmission filter arrangement 910 that can be installed instead of the transmission filter arrangement 22 in the region of the pupil surface of the imaging objective 15 from FIG. 1. The retardation device consists of a thin plate 920 made from calcium fluoride with a circular cross section that is mounted inside a mount 940. A thin film polarizer is located downstream thereof in the direction of view. Assigned to the retardation element 920 for the purpose of stressing it mechanically in a target fashion is a stressing device 930 that comprises in the case of the example eight actuators 931 to 938 that are distributed uniformly around the circumference of the retardation plate 920 and respectively act on the edge of the retardation plate outside the optically used region, doing so in a radial direction. The actuators form four actuator pairs each having two actuators lying diametrically opposite one another in relation to the central axis 925. It is thereby possible to produce within the retardation plate 920 various spatial distributions of local stressed states that are radially symmetric relative to the central axis 925. The actuators of an actuator pair are designed such that they respectively exert on the retardation element a radial compressive stress that is symmetrical relative to a plane that is perpendicular to the straight lines connecting the acting points of the actuators. A stress distribution is shown by way of example in FIG. 9, there existing inside the retardation element local stresses that are proportional to the brightness of the regions in the illustration. It is, for example, possible to detect thereby that the actuator pair 931, 932 and the actuator pair 933, 934 aligned at a right angle thereto introduce substantially the same compressive stress into the retardation element, while the actuator pairs 935, 936 and 937, 938 lying therebetween introduce compressive stresses different therefrom and also in comparison with one another. Consequently, a spatial stressed distribution having two-fold radial symmetry is produced thereby. The most different stressed states can be produced in the retardation element, and different transmission states can thereby be produced, by a suitable selection of the forces F1 to Fn. Periodic modulations are also conceivable in this case.

Various transmission distributions of the transmission filter arrangement are illustrated schematically in FIG. 10 by virtue of the fact that regions of greater transmission appear bright, and regions of lesser transmission appear darker. In the left-hand subfigure (a), a transmission distribution is shown that results when only phase retardations from the range $0<\delta<\pi$ are set. In the case of the example, two regions of lesser transmission are produced which cross one another and between which regions of greater transmission lie in four edge regions of the retardation plate that are offset respectively by 90°. The right-hand subfigure (b) shows an example of a transmission distribution that results when phase retardations of higher orders are set in the range $0<\delta<4\pi$. Given this stronger stressing, a number of periods of the retarding effect traverse the cross section of the retardation element such that a number of strip-shaped regions of high transmission lie between individual regions of lesser transmission (dark).

In one embodiment, the actuators of the stressing device are formed by screws that act on the mount for the retardation element and on the retardation element. Stresses that are more or less great are produced as a function of screw position. In this way, once a rotary position of the screws has been fixed it is possible to provide a retardation element whose retarding effect varies locally but is permanently prescribed. If the rotary position of the screws can be varied by an external control device given a retardation device that is installed, it is also possible to control the filtering effect of the transmission filter dynamically. In another embodiment, electrically drivable piezoelectric actuators are provided that can be driven in order to produce a temporally variable, spatially dependent retarding effect of the retardation element 920 in an electrically continuous fashion.

The invention claimed is:

1. An illumination system for a microlithography projection exposure machine for illuminating an illumination field with light from a primary light source, comprising:
   a pupil shaping unit configured to produce a prescribed light distribution in a pupil plane of the illumination system;
   a transmission filter apparatus configured for spatially dependent intensity filtering of an incident light distribution, the transmission filter apparatus being arranged at or in a vicinity of the pupil plane of the illumination system or at or in a vicinity of a further pupil plane conjugate to the pupil plane;
   wherein the transmission filter apparatus includes at least one retardation device configured to be operated in transmission to produce a spatially dependent retarding effect on the light of the incident light distribution, where the retardation device is configured to be driven to produce a temporally variable, spatially dependent retarding effect; and
   at least one polarization filter arrangement arranged in a light path downstream of the retardation device.

2. The illumination system according to claim 1, wherein the transmission filter apparatus is arranged in a plane having a numerical aperture <0.1.

3. The illumination system according to claim 1, wherein the illumination system includes a field intermediate plane optically downstream of the pupil shaping unit and an imaging objective configured to image the intermediate field plane onto the illumination field of the illumination system,
   wherein the transmission filter apparatus is arranged at or in a vicinity of the further pupil plane of the imaging system.

4. The illumination system according to claim 1, configured without a light mixing unit for homogenizing the illuminating light.

5. The illumination system according to claim 1, further comprising a regulating unit connected to a control device connected to the transmission filter arrangement and to the pupil shaping unit, the regulating unit being configured to tune the spatially dependent intensity filtering provided by the transmission filter arrangement to the light distribution provided in the pupil plane at or in the vicinity of the transmission filter apparatus.

6. The illumination system according to claim 5, wherein the control device is configured to control the transmission filter apparatus such that a transmission filter effect of the transmission filter apparatus is adapted to a minimum intensity value of the incident light distribution such that the transmission filter apparatus is effective to homogenize the incident light distribution by reducing local transmission in areas outside a region of minimum intensity in the incident light distribution.

7. The illumination system according to claim 1, wherein the retardation device is configured to be continuously driven to produce a temporally variable, spatially dependent retarding effect.

8. The illumination system according to claim 1, wherein the retardation device comprises a cell arrangement having a plurality of cells configured to be driven individually and independently of one another.

9. The illumination system according to claim 8, wherein the cell arrangement comprises at least one nonlinear optical crystal producing a linear electro-optical effect in the light passage direction of the incident light distribution.

10. The illumination system according to claim 9, wherein the nonlinear optical crystal is transparent to light in a wavelength region below 200 nm.

11. The illumination system according to claim 9, wherein the nonlinear optical crystal consists essentially of one of beta barium borate (BBO), potassium hydrogen phosphate (KDP), deuterated potassium hydrogen phosphate (DKDP) and lithium triborate (LBO).

12. The illumination system according to claim 9, wherein the nonlinear optical crystal is designed as a plane plate that completely covers the region of incident light distribution and has a first and second plate face.

13. The illumination system according to claim 12, wherein a plurality of first electrodes electrically separated from one another are mounted on the first plate face and a plurality of second electrodes electrically separated from one another are mounted on the second plate face, and first and second electrodes are assigned to one another in pairs to form a plurality of electrode pairs electrically separated from one another, each electrode pair defining a cell of the cell arrangement.

14. The illumination system according to claim 12, wherein a plurality of first electrodes electrically separated from one another are mounted on the first plate face, and at least one second electrode is mounted on the second plate face, a number of first electrodes being assigned a common second electrode.

15. The illumination system according to claim 12, wherein a plurality of first electrodes electrically separated from one another are mounted on the first plate face, and the second plate face has a single second electrode to which the plurality of first electrodes are assigned.

16. The illumination system according to claim 12, wherein electrodes electrically separated from one another are arranged on the crystal at a spacing from one another that is large compared with a plate thickness of the nonlinear optical crystal.

17. The illumination system according to claim 12, wherein electrodes mounted on at least one face of the plane plate are substantially free from material tips causing high field strengths.

18. The illumination system according to claim 12, wherein electrodes are mounted on at least one face of the plane plate and wherein at least one electrode is coated with an antireflection layer.

19. The illumination system according to claim 12, wherein electrodes are mounted on at least one face of the plane plate and wherein at least one electrode is designed as a grid electrode having a plurality of webs made from electrically conducting material, the webs being spaced apart from each other such that a high transparent area fraction is obtained.

20. The illumination system according to claim 12, wherein electrodes are mounted on at least one face of the plane plate and wherein the electrodes are designed to be partially transparent such that a transmission loss caused in the incident light distribution by the electrodes is less than 20% upon passage through the cell arrangement.

21. The illumination system according to claim 12, wherein electrodes are mounted on the first face and the second face of the plane plate, and a control device is assigned to the transmission filter apparatus and configured to produce electrical potential differences independently of one another between first electrodes electrically separated from one another on the first plate face and respective assigned electrodes of the second plate face.

22. The illumination system according to claim 1, wherein the retardation device comprises at least one retardation element made from a stress birefringent material, and further comprising a stressing device having at least one actuator acting on the retardation element to set a prescribed stressed state of the retardation element in accordance with a prescribed spatial distribution.

23. The illumination system according to claim 22, wherein the retardation device has only a single retardation element in the form of an essentially plane-parallel plate.

24. The illumination system according to claim 22, wherein the stressing device has at least one actuator pair with a pair of actuators that are arranged diametrically opposite one another with reference to a central axis of the retardation element.

25. The illumination system according to claim 22, wherein the stressing device comprises a number of actuator pairs configured to be driven independently of one another.

26. The illumination system according to claim 22, wherein the stressing device is designed to set the stress distributions that exhibit a multiple radial symmetry with reference to a central axis of the retardation element.

27. The illumination system according to claim 26, wherein the multiple radial symmetry is one of a 2-fold, 4-fold, 6-fold and 8-fold radial symmetry.

28. The illumination system according to claim 1, further comprising a movement device is assigned to the retardation device for moving the retardation device relative to other components of the transmission filter apparatus.

29. The illumination system according to claim 28, wherein the movement device is designed as a rotation device configured to rotate the retardation device about an axis of rotation coinciding with an optical axis of the illumination system.

30. The illumination system according to claim 1, further comprising a changing device is assigned to the transmission filter apparatus and configured to interchange a first retardation device with a first spatially dependent retarding effect against at least one second retardation device with a second spatially dependent retarding effect that differs from the first retarding effect.

31. The illumination system according to claim 1, further comprising a polarizer arrangement arranged in a light path upstream of the retardation device to provide at least a partially polarized incident light distribution striking the retardation device.

32. The illumination system according to claim 31, wherein the polarization filter arrangement comprises at least one thin film polarizer.

33. The illumination system according to claim 1, wherein the polarization filter arrangement comprises at least one transparent plane plate that is arranged substantially at the Brewster angle with respect to the incident light.

34. The illumination system according to claim 1, wherein the polarization filter arrangement comprises at least one polarization splitter block with a polarization splitter layer that is enclosed between transparent material and is arranged substantially at the Brewster angle with reference to the incident light.

35. An exposure method for exposing a substrate arranged in a region of an image plane of a projection objective with at least one image of a pattern, arranged in a region of an object plane of the projection objective, of a mask, comprising:
   illuminating the pattern with the aid of illuminating radiation from an illumination system as claimed in claim 1 to produce radiation modified by the pattern; and
   transirradiating the projection objective with the aid of the radiation modified by the pattern to produce an output radiation directed onto the substrate;
   the intensity distribution of the illuminating radiation in the object plane of the projection objective being variably set as a function of space and time with the aid of the transmission filter apparatus.

36. The exposure method as claimed in claim 35, further comprising:
   setting a first light distribution using the pupil shaping unit;
   performing a first spatially dependent intensity filtering utilizing the transmission filter apparatus;
   setting a second light distribution at the pupil shaping unit, the second light distribution differing from the first light distribution; and
   filtering the second light distribution at the transmission filter apparatus.

37. The exposure method according to claim 35, wherein the intensity distribution of the illuminating radiation is set with the aid of the control device to the minimum intensity value of the incident light distribution in order to produce a homogenizing effect.

* * * * *

UNITED STATES PATENT AND TRADEMARK OFFICE
CERTIFICATE OF CORRECTION

| | | |
|---|---|---|
| PATENT NO. | : 7,940,375 B2 | Page 1 of 1 |
| APPLICATION NO. | : 10/591591 | |
| DATED | : May 10, 2011 | |
| INVENTOR(S) | : Damian Fiolka et al. | |

It is certified that error appears in the above-identified patent and that said Letters Patent is hereby corrected as shown below:

Column 6, Line 58: delete "lafter" and insert -- latter --

Column 8, Line 33: delete "aftain" and insert -- attain --

Column 11, Line 56: delete "fields" and insert -- field --

Signed and Sealed this
Tenth Day of July, 2012

David J. Kappos
*Director of the United States Patent and Trademark Office*